(12) United States Patent
Chang et al.

(10) Patent No.: US 8,997,034 B2
(45) Date of Patent: Mar. 31, 2015

(54) EMULATION-BASED FUNCTIONAL QUALIFICATION

(71) Applicant: Synopsys, Inc., Mountain View, CA (US)

(72) Inventors: Ying-Tsai Chang, Fremont, CA (US); Yu-Chin Hsu, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 81 days.

(21) Appl. No.: 13/954,140

(22) Filed: Jul. 30, 2013

(65) Prior Publication Data

US 2015/0040096 A1 Feb. 5, 2015

(51) Int. Cl.
*G06F 17/50* (2006.01)

(52) U.S. Cl.
CPC .................................. *G06F 17/5081* (2013.01)
USPC ........... 716/136; 716/100; 716/106; 716/107; 703/13; 703/14; 703/23; 703/27; 703/28

(58) Field of Classification Search
USPC .................... 703/13, 14, 23, 27–28; 716/100, 716/106–107, 136
See application file for complete search history.

(56) References Cited

U.S. PATENT DOCUMENTS

| | | | |
|---|---|---|---|
| 6,629,296 B1* | 9/2003 | Ganesan et al. | 716/106 |
| 8,719,762 B2* | 5/2014 | Chang et al. | 716/136 |
| 2010/0057424 A1* | 3/2010 | Grosse et al. | 703/14 |

* cited by examiner

*Primary Examiner* — Paul Dinh
(74) *Attorney, Agent, or Firm* — Kilpatrick Townsend & Stockton LLP

(57) ABSTRACT

Techniques for emulation-based functional qualification are disclosed that use an emulation platform to replace simulation in mutation-based analysis. A method for functional qualification of an integrated circuit design includes receiving an integrated circuit design having one or more mutations. Emulation setup and activation simulation are performed in parallel to maximize computing resources. A prototype board can then be programed according to the integrated circuit design and a verification module. A set of test patterns and response generated by a simulation of the integrated circuit using the set of test patterns are stored in a memory of the prototyping board allowing enumeration of mutants to occur at in-circuit emulation speed.

21 Claims, 11 Drawing Sheets

EMULATION-BASED FUNCTIONAL QUALIFICATION

CROSS-REFERENCES TO RELATED APPLICATIONS

This Application claims the benefit of and priority to U.S. Provisional Patent Application No. 61/667,219, filed Jul. 30, 2012 and entitled "Emulation-Based Functional Qualification," the entire disclosure of which is hereby incorporated by reference.

FIELD OF THE INVENTION

The present disclosure generally relates to design verification methods and systems for semiconductor or integrated circuit devices and, more specifically, to design verification systems and methods utilizing emulation-based functional qualification.

BACKGROUND OF THE INVENTION

Various semiconductor, circuit, and integrated circuit ("IC") devices, such as system-on-chip ("SoC") devices, are emulated or verified during their design and development processes. As an example, highly-integrated SoC devices may power or support a wide variety of products to facilitate various hardware, software, and/or device applications. To meet these demands, SoC devices continue to increase in size and complexity, and their capabilities and manufacturability are in part aided by advance semiconductor processing technologies and availability of verified and well-developed libraries, e.g. design or circuit intellectual property ("IP") libraries. The development of SoCs or other circuits or devices in some cases nevertheless may increase the burden on design verification processes, methods, or systems. In some cases, verification may consume a significant amount of time or resources during an SoC development cycle.

Circuit design verification approaches can vary. Given the expectation for speed, the various approaches of software development, hardware development, or system validation may provide varying levels of observability and control. Field programmable gate array ("FPGA") prototype systems, for example, can provide improved system execution time due to its hardware-based implementation. Some FPGA verification systems, nevertheless, lack the ability to isolate some of the root causes of discoverable errors for various reasons. For example, the lack of visibility regarding the multitude of signals within the design. Depending on the environment, software, and hardware constraints, in some cases, deficiencies in certain FPGA vendor-specific verification tools may include access to a limited number of signals, and limited sample capture depth. Even combined with an external logic analyzer, FPGA vendor-specific verification tools, in some instances, may lack sufficient capabilities to isolate root cause errors during design verification.

Functional qualification is a technology that provides an objective answer to the question of whether there is a bug or other defect in the design of an integrated circuit. Functional qualification has become an important addition to solutions available for the increasingly challenging task of delivering functionally correct silicon on time and on budget. Functional qualification enables the rapid improvement and cost reduction of verification.

To be effective, verification must ensure that designs are shipped without critical bugs. To find a design bug, at least three things must occur during the execution of the verification environment. First, the bug must be activated. In other words, the code containing the bug must actually be exercised. Second, the bug must be propagated to an observable point (e.g., to the outputs of the design). Third, the bug must be detected (i.e. behavior is checked and a failure indicated).

Traditional electronic design automation (EDA) technologies have focused on the first aspect, activating the bug. Techniques such as code coverage and functional coverage can help ensure that design code is well-activated. However, these techniques do not guarantee that design bugs will be propagated to an observable point. Nor can they guarantee that the bugs will be detected by any checkers, assertions, or comparison against a reference model.

Functional qualification automatically inserts artificial bugs into the design and determines if the verification environment can detect these bugs. A known artificial bug that cannot be detected points to a verification weakness. If an artificial bug cannot be detected, there may be evidence that actual design bugs would also not be detected by the verification environment. Functional qualification tools help users understand the nature of these verification weaknesses thus providing new information to the verification engineer (verifier).

When designs are increasingly complex, functional qualification becomes more difficult for designers. In general, simulation-based verification methods are the mainstream in the current design flow, especially for large designs. Due to the fact that exhaustive simulation is infeasible, metrics can be used measure the quality of verification and thus reduce the simulation cost. However, the completeness problem still remains in that even with a reduced simulation cost, such simulations are still a limiting factor in the verification process.

Accordingly, what is desired is to solve problems relating to functional qualification, some of which may be discussed herein. Additionally, what is desired is to reduce drawbacks relating to functional qualification, some of which may be discussed herein.

BRIEF SUMMARY OF THE INVENTION

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

Techniques for emulation-based functional qualification are disclosed that use an emulation platform to replace simulation in mutation-based analysis. For functional qualification of an integrated circuit design, one or more mutations are inserted into an integrated circuit design. Emulation setup and activation simulation are performed in parallel to maximize computing resources. A prototype board can then be programed according to the integrated circuit design and a verification module. A set of test patterns and response generated by a simulation of the integrated circuit using the set of test patterns are stored in a memory of the prototyping board allowing enumeration of mutants to occur at in-circuit emulation speed.

In one embodiment, for functional qualification of an integrated circuit design, one or more mutations are inserted into an integrated circuit design. In one aspect, look-up table (LUT)-based mutants are utilized in additional to RTL instrumentation. A prototype board is programed according to the integrated circuit design and a verification module. A set of test patterns and response generated by a simulation of the integrated circuit using the set of test patterns is stored in a memory of the prototyping board allowing mutation information from the verification module to be generated at in-chip emulation (ICE) speed based on the set of test patterns stored in the memory of the prototyping board.

In one embodiment, programming the prototype board according to the integrated circuit design and the verification module includes programming the prototype board such that one or more of the one or more mutations are a look-up table-based mutant in the integrated circuit design allowing rapid mutant reconfiguration. Programming the prototype board according to the integrated circuit design and the verification module may include programming the prototype board such that one or more of the one or more mutations are an RTL-level mutant allowing rapid mutant reconfiguration using a constant net. The verification module may probe one or more signals from the integrated circuit design under test and compare the one or more probed signals to the response stored in the memory of the prototyping board. The verification module may generate the mutation information based on results of comparing the one or more probed signals to the response stored in the memory of the prototyping board.

A further understanding of the nature of and equivalents to the subject matter of this disclosure (as well as any inherent or express advantages and improvements provided) should be realized in addition to the above section by reference to the remaining portions of this disclosure, any accompanying drawings, and the claims.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

DETAILED DESCRIPTION OF THE INVENTION

Figure 1:
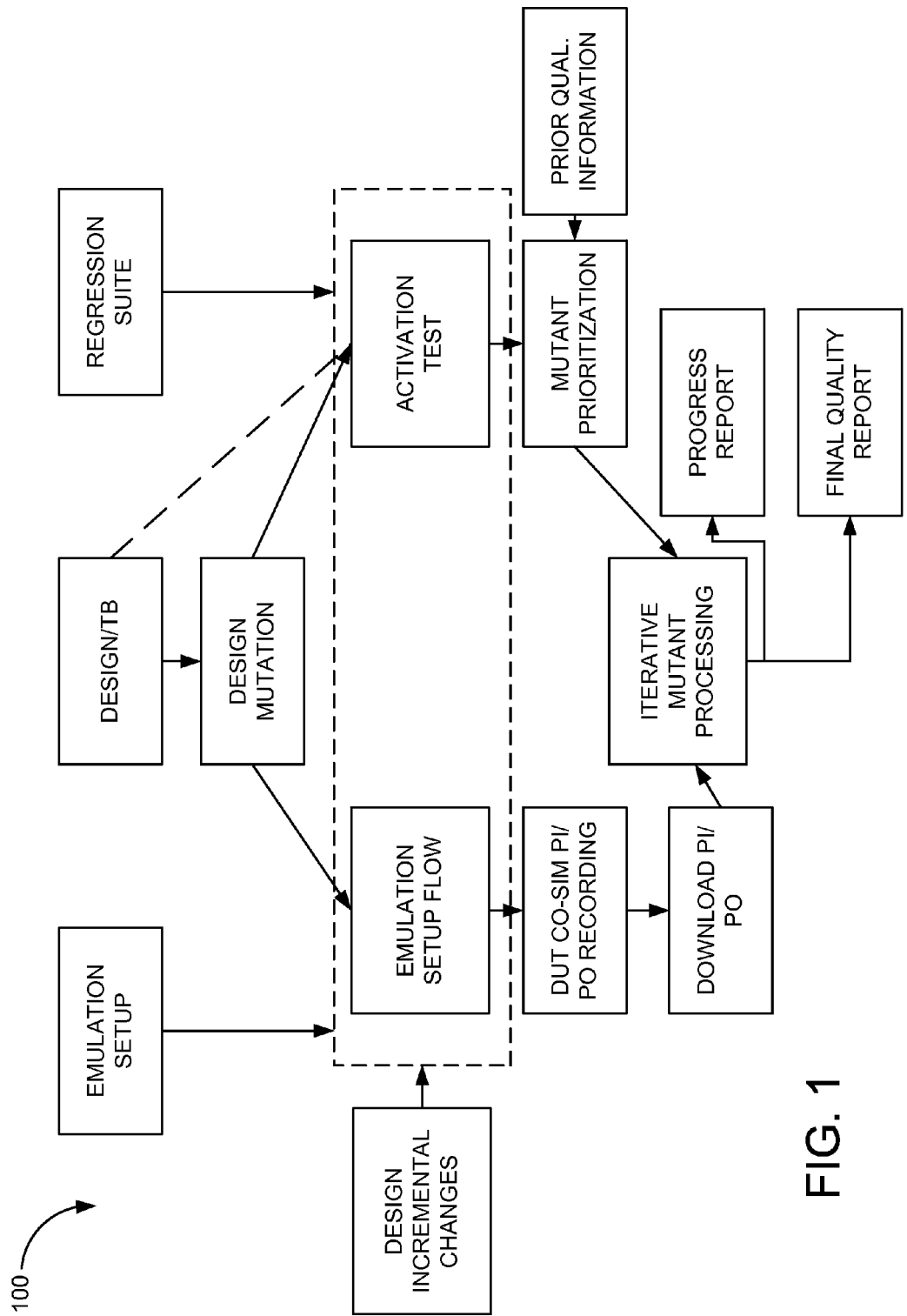
FIG. 1 is a block diagram illustrating an exemplary emulation-based functional qualification system consistent with disclosed embodiments.

Techniques for emulation-based functional qualification are disclosed that use an emulation platform to replace simulation in mutation-based analysis. For functional qualification of an integrated circuit design, one or more mutations are inserted into an integrated circuit design. Emulation setup and activation simulation are performed in parallel to maximize computing resources. A prototype board can then be programed according to the integrated circuit design and a verification module. A set of test patterns and response generated by a simulation of the integrated circuit using the set of test patterns are stored in a memory of the prototyping board allowing enumeration of mutants to occur at in-circuit emulation speed.

In various embodiments, emulation-based functional qualification uses an emulation platform to replace simulation in mutation-based analysis. The application of emulation to functional qualification in the verification domain can have a much broader impact than fault emulation at testing. In fact, the combination of emulation and functional qualification brings greater value to both individual domains.

Functional qualification as used herein relates to qualifying the quality of test harness (e.g., the software, tools, samples of data input and output, and configurations) and identify verification holes. Thus, the quality of the verification environment can be measured and any verification holes identified that could hide design bugs.

In one aspect, the test harness may refer to one or more deterministic regression test suites from either directed or constraint random simulation. Test quality may be qualified by testing whether some artificially introduced design mutation (mutant) could be detected by the regression suite. Detection may include both activation (traditional coverage) and propagation (effect observed). In the functional context, faults generally refer to RTL functional faults rather than manufacturing faults.

Prior tool offerings in this area usually require a large computation amount needed for analysis in lieu of good heuristic. One more recent tool offering, Certess from Certitude adopted a good heuristic to achieve early detection of verification holes with a reasonable amount of simulation time (~x5 of full regression runtime). In addition, the tool incorporated transparent usage flow independent of the simulator being used.

An exhaustive verification hole search might take (# mutant)×(regression simulation runtime), where # mutant is proportional to circuit size. With this heuristic and activation test, one might be able to detect a verification hole in (small number of mutant)×(small ratio of activated simulation)× (regression simulation runtime.

In contrast to the simulation above, the concept of an emulation platform is to instantiate the design in reconfigurable fabrics (e.g., FPGA) as true hardware to perform the functionality of the hardware design for verification. This methodology incurs a long setup effort but the return is several orders of magnitude improvement in verification performance. One major bottleneck of achieving optimal speed (ICE speed) is the capability of generating and feeding useful test vector into a device under test (DUV). This is referred to herein as the pattern feeding problem. The best case is that all test vector are generated by synthesizable hardware IP or real hardware (connect with speed bridge) so that everything could be run in hardware with in-chip execution (ICE) speed. However, in many situations, such as in a testbench migrated from a simulation test, the testbench environments are not synthesizable and need to be run as software.

Therefore, the interaction of a software testbench (TB) with hardware DUT may significantly drag down performance such as in co-simulation per cycle communication. One approach of addressing this issue is to use co-emulation to decouple per cycle communication into transaction-based communication and also expedite software execution with transaction level modeling.

Emulation-Based Functional Qualification System

FIG. 1 is a block diagram illustrating emulation-based functional qualification system 100 consistent with disclosed embodiments. In this example, emulation-based functional qualification system 100 naturally addresses the above pattern feeding problem. Emulation-based functional qualification system 100 applies the same set of test patterns, e.g. from a regression suite, to a design with varying mutants. In this example, emulation-based functional qualification system 100 includes blocks for emulation setup, design/testbench, regression suite, design mutations, design incremental changes, emulation setup flow, DUT co-simulation PI/PO recording, download PI/PO, activation test, mutant prioritization, prior qualification information, iterative mutant processing, progress report, and final quality report.

In one aspect, the set of test patterns (PI) is captured in a golden co-simulation regression run. Later runs are driven by this set of test pattern in the hardware by directly storing them in a memory (e.g., RAM) on the hardware and directly feeding into them into the DUV to achieve ICE speed, such as in the most expensive repetitive mutant testing runs.

In another aspect, the golden response (PO) is also captured in the same co-simulation run and stored for response comparison to alleviate the need of duplicate golden design as in miter-based approach. The capability of effectively (ICE speed) feeding meaningful patterns into an emulation platform to provide value (functional qualification) into the verification process provides a key competitive advantage for the emulation platform.

In various embodiments, the need of an excellent heuristic in simulation-based functional qualification is due to the speed as compared to full regression simulation runtime. Exhaustive search has a complexity of $O(n^2)$ of the circuit size. Emulation reduces this into $O(n)$. With emulation speed up, an exhaustive search might be possible. The reliance on a good heuristic could be lower and the result could be exhaustive with no evident hole discovery barrier as in simulation-based approaches.

Accordingly, even before an exhaustive search is done, one should be able to have good probability of early reporting verification holes during the process. Emulation-based functional qualification utilizes the following characteristics, such as parallel setup flow, fast circuit emulation speed (ICE), and co-simulation usage flow with PI/PO recording. In a further aspect, fast (look-uptable LUT) reconfiguration is performed (force/release/functionality ECO).

Figure 2:
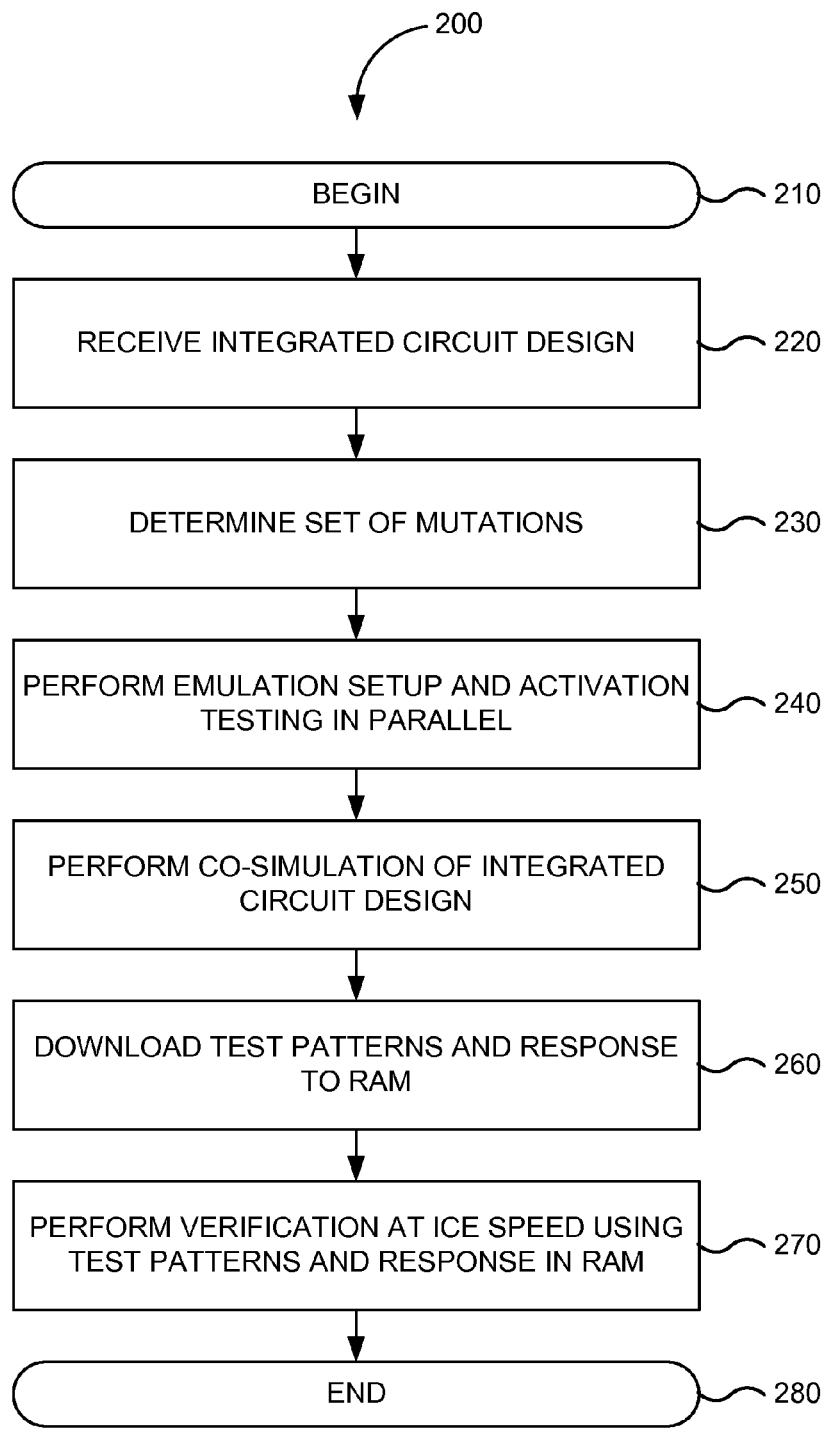
FIG. 2 is a flowchart of a method for functional qualification of an integrated circuit design in one embodiment.

FIG. 2 is a flowchart of method 200 for functional qualification of an integrated circuit design in one embodiment. Implementations of or processing in method 200 depicted in FIG. 2 may be performed by software (e.g., instructions or code modules) when executed by a central processing unit (CPU or processor) of a logic machine, such as a computer system or information processing device, by hardware components of an electronic device or application-specific integrated circuits, or by combinations of software and hardware elements. Method 200 depicted in FIG. 2 begins in step 210.

In step 220, an integrated circuit design is received. In accordance with some embodiments, a design is received from a design database structured collection of tables, lists, or other data for design verification setup and runtime execution. As such, the structure can be organized as a relational database or an object-oriented database. In some embodiments, the design database can be a hardware system comprising physical computer readable storage media and input and/or output devices configured or be capable of being configured to receive and provide access to tables, lists, or other data structures.

In accordance with some embodiments, the design can include at least one of instrumentation circuitry and logic modules configured or be capable of being configured to perform traditional logic analysis instrumentation functions. In some embodiments, the design can be synthesizable or soft intellectual property (IP). During setup in some embodiments, a setup flow can automatically integrate third party synthesis and place and route tools, automatically or manually partition a design, and construct a design database for runtime software usage. A setup flow can include, for example, an automatic process for a pre-partitioned design, where a register transfer language (RTL) partitioning tool includes either a third party tool or a user's own manual partitioning. In some embodiments, the design can be defined by Hardware Description Language (HDL) code to form an image data that can be downloaded to at an FPGA. In some other embodiments, the design can be defined by netlist descriptions.

In step 230, a set of mutations is determined. Mutation testing involves modifying the integrated circuit design in some, usually, small ways. Each mutated version is called a mutant and tests detect and reject mutants by causing the behavior of the original version to differ from the mutant. Test suites are measured by the percentage of mutants that they detect. Mutants can be based on well-defined mutation operators that either mimic typical errors or force the creation of valuable tests. One purpose is to help the tester develop effective tests or locate weaknesses in the test data used for the design or in sections of the design that are seldom or never accessed during execution.

In some embodiments, look-up table (LUT)-based mutants are determined in additional to RTL instrumentations. An RTL mutant may be inserted into an RTL design via a controlled mux insertion in one pass so that only one emulation setup flow pass is needed. LUT mutants can be used instead of RTL mutant if possible to reduce area overhead. For RTL-level mutant instrumentation, the mutant may be controlled by a constant net whose value could be forced, i.e. they are turned off by default but could be turned on with selectMAP addressing. This provides instant mutant re-configurability and alleviates routing need for mutant activation.

In one aspect, LUT-based mutant provides an efficient and convenient mutant injection mechanism via selectMAP. This mechanism is still general enough (e.g., stuck-at, inverse, alternative function) for qualification. It also can be used to reduce the amount of RTL-level mutant instrumentation need.

In step 240, the emulation setup and the activation testing are performed in parallel. Both can be long processes that take a lot of computing resources. Both can be parallelized over a server farm, for example, for acceleration.

In step 250, perform co-simulation of the integrated circuit design. Therefore, at least one good circuit co-simulation is performed on the regression suite and record all PIO. In one aspect, the recorded PIO is cached or stored to speed up the verification process. In the perfect setting, this might replace simulation regression fully. It is also desirable to compare this with simulation regression PIO to detect any synthesis mismatch.

Accordingly, in step 260, the test patterns and values are downloaded to the hardware (e.g., a memory device or other RAM). In step 270, verification is performed at ICE speed using test patterns and response in RAM. In various embodiments, each mutation is enumerated on the pre-recorded PIO pattern at ICE speed with result checking for verification hole detection. Since PIO is recorded and downloaded into emulator RAM, the whole process may be performed in ICE speed with direct pattern feed with no need for any interaction from a test bench.

In one aspect, strictly comparing PIO provides PO visibility of the mutant. This visibility is different from strict failure visibility. One major class of difference is the mutants that cause cycle-behavior change but not functional (transaction) change. These two visibility may be bridged with synthesizable monitor/checker or recorded PO post-processing. The later reduces the early abort of PO visibility.

In various embodiments, enumeration does not need to complete all test in a regression suite for each mutant or for all mutant. If a test shows propagation, the test could be stop and no other test run is needed. In further embodiments, the flow can take advantage of successive incremental design/test change between regression simulation runs as well as other prioritization/merging heuristic. FIG. 2 ends in step 280.

Therefore, the emulation platform replaces simulation in mutation-based analysis as an effective hardware-assisted sequential functional fault simulation. As discussed above, emulation setup and activation are performed in parallel to maximize computing resources. With a prototype board programed according to the integrated circuit design together with mutants and a verification module, a set of test patterns and response generated by a simulation of the integrated circuit using the set of test patterns are stored in a memory of the prototyping board allowing enumeration of mutants to occur in ICE speed. Feeding the pattern with a standard bus and FIFO is inefficient. It is more efficient to use a direct pattern feeding on a DUT from RAM as discussed above. Moreover, a miter-based approach uses both golden/fault design instantiation for response comparison. The above PO recording and comparison at ICE speed is also more efficient.

Figure 3:
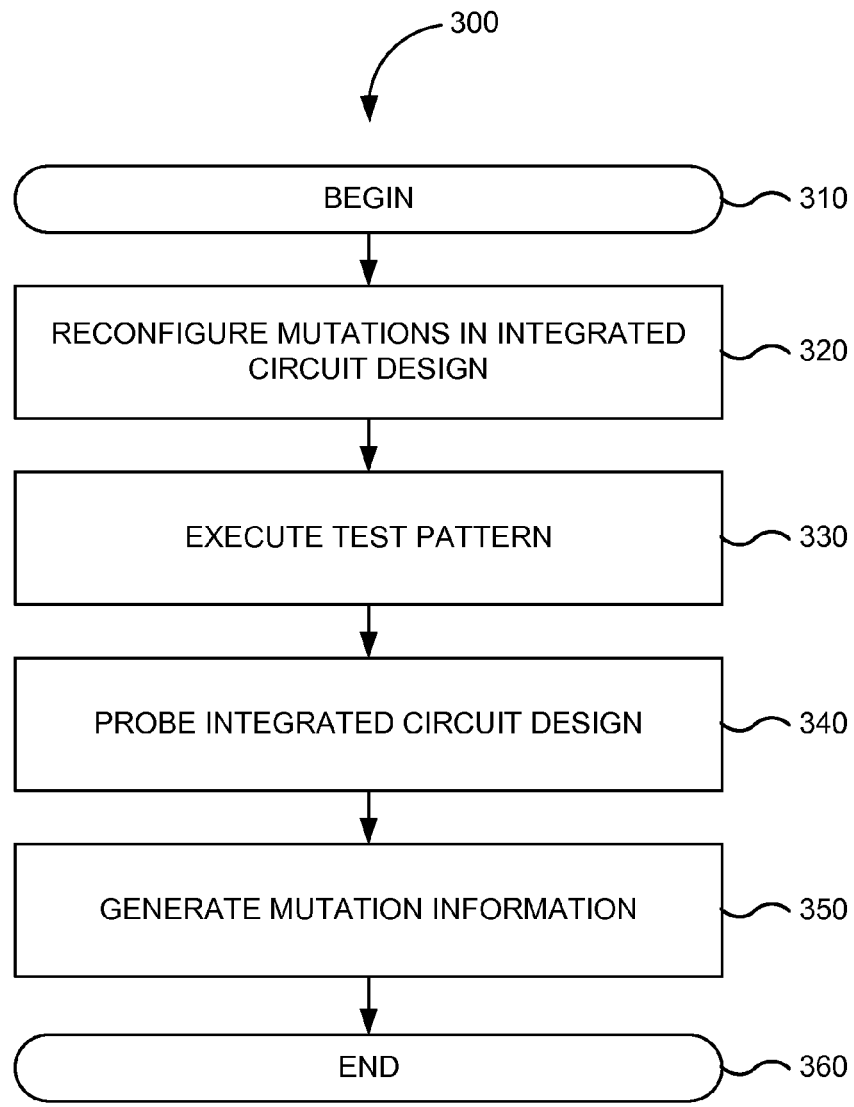
FIG. 3 is a flowchart of a method for implementing rapid mutant activation in one embodiment.

FIG. 3 is a flowchart of a method for implementing rapid mutant activation in one embodiment. Implementations of or processing in method 300 depicted in FIG. 3 may be performed by software (e.g., instructions or code modules) when executed by a central processing unit (CPU or processor) of a logic machine, such as a computer system or information processing device, by hardware components of an electronic device or application-specific integrated circuits, or by combinations of software and hardware elements. Method 300 depicted in FIG. 3 begins in step 310.

In step 320, mutations in integrated circuit design are reconfigured. As discussed above, reconfiguration may be implemented as look-up table (LUT)-based mutants in additional to RTL instrumentations. For example in RTL-level mutant instrumentation, the mutant may be controlled by a constant net whose value could be forced, i.e. they are turned off by default but could be turned on with selectMAP addressing. This provides instant mutant re-configurability and alleviates routing need for mutant activation. In another aspect, LUT-based mutant provides an efficient and convenient mutant injection mechanism via selectMAP. In prior systems, binary encoding based mutant activation reduces routing overhead compared to direct control lines. However, it still requires excessive routing resources. LUT reconfiguration as discussed herein is much more efficient.

In step 330, the test pattern is executed. In step 340, the integrated circuit design is probed. For example, a verification module can include a design-dependent circuit, configured or be capable of being configured to connect to and probe specific signals. A probe or signal probe can include circuitry configured to analyze or sample the state of a particular signal. Data dependent circuitry can be reconfigured during a test process to modify, remove, or add probes. In some embodiments, the signals to be probed by verification module are specified as well as the frequency of monitoring those signals to be probed. The verification module can also include design-independent circuits configured or be capable of being configured to encode and decode data.

In step 350, mutation information is generated. In one example, one or more mutation operators may be identified. Some examples of mutation operators include logic or functionality deletion, subexpression replacement, operation replacement, relationship replacement, and variable replacement. FIG. 3 ends in step 360.

In various embodiments, emulation-based functional qualification system 100 can take advantage of successive incremental design/test change between regression simulation runs as well as other prioritization/merging heuristic.

Figure 4:
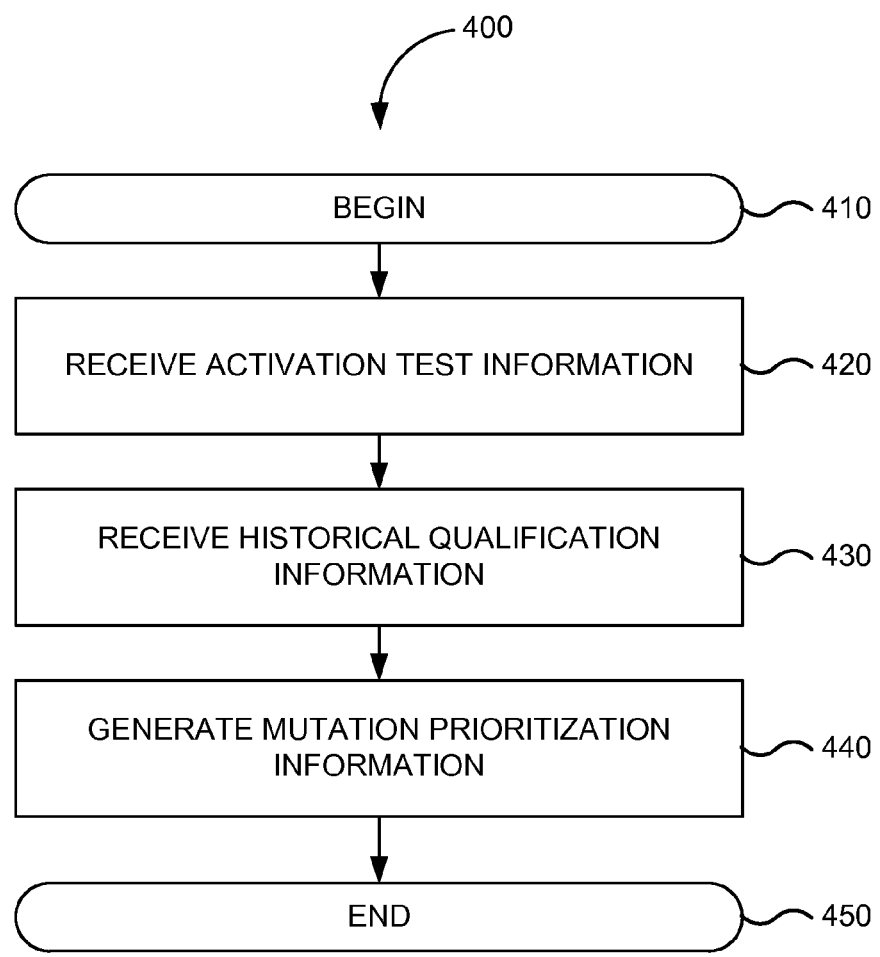
FIG. 4 is a flowchart of a method for prioritizing mutants in one embodiment.

FIG. 4 is a flowchart of a method for prioritizing mutants in one embodiment. Implementations of or processing in method 400 depicted in FIG. 4 may be performed by software (e.g., instructions or code modules) when executed by a central processing unit (CPU or processor) of a logic machine, such as a computer system or information processing device, by hardware components of an electronic device or application-specific integrated circuits, or by combinations of software and hardware elements. Method 400 depicted in FIG. 4 begins in step 410.

In step 420, activation test information is received. Activation test information may include a complete regression simulation and analysis of the behavior of a verification environment with respect to a set of mutations. In step 430, historical qualification information is received. Historical qualification information may include results of prior qualification tests. In step 440, mutation prioritization information is generated.

Emulation-based functional qualification system 100 may prioritize mutants based on the activation test information and optionally on the historical qualification information. Prioritization may include the ordering of the enumeration of a mutant, the decision whether to enable/disable testing for a predetermined mutant, and the like to facilitate verification. Mutant prioritization is not considered in prior solutions. FIG. 4 ends in step 450.

Figure 5:
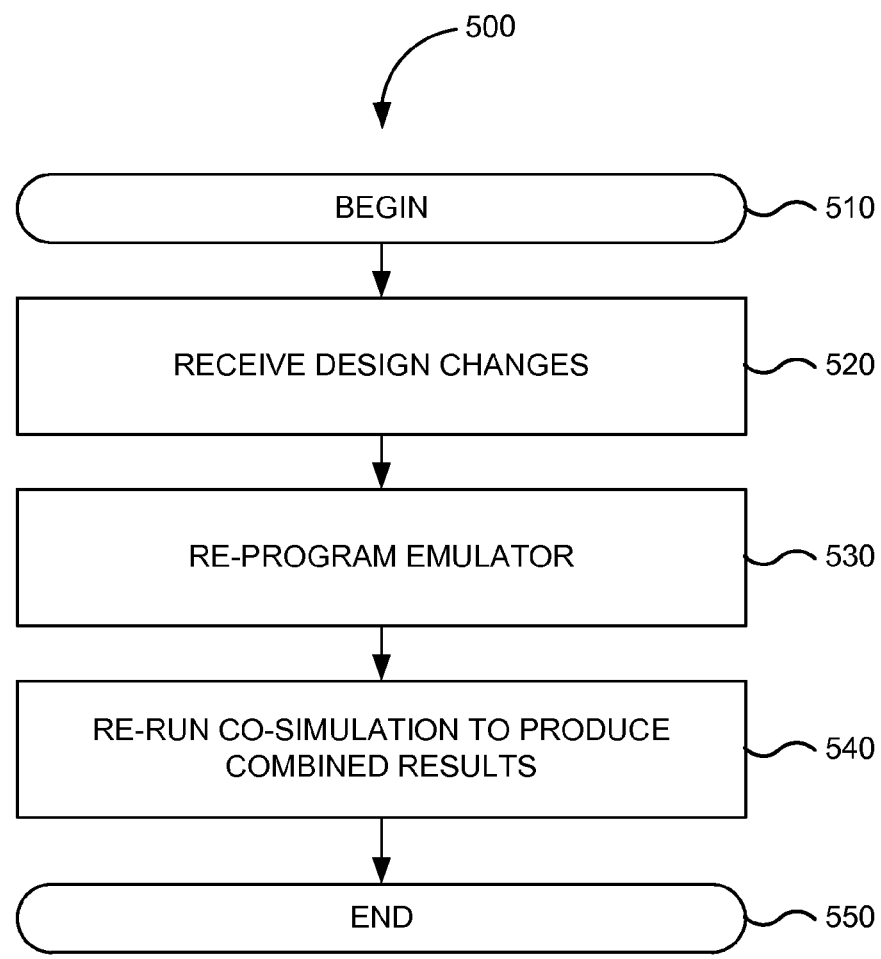
FIG. 5 is a flowchart of functional qualification of an integrated circuit design in one embodiment in view of design changes.

FIG. 5 is a flowchart of functional qualification of an integrated circuit design in one embodiment in view of design changes. Implementations of or processing in method 500 depicted in FIG. 5 may be performed by software (e.g., instructions or code modules) when executed by a central processing unit (CPU or processor) of a logic machine, such as a computer system or information processing device, by hardware components of an electronic device or application-specific integrated circuits, or by combinations of software and hardware elements. Method 500 depicted in FIG. 5 begins in step 510.

In step 520, design changes are received. In step 530, the emulator is re-programed according to the design changes. In step 540, co-simulation is re-run to produce combined results. Accordingly, emulation-based functional qualification system 100 may optimize additional verification based on the differences between the designs. Prioritization of mutants may be affected by the design changes, such as whether the design is affected by a design change. If a test is related to a non-affected portion of the design, the test could be stop and no other test run is needed for that portion. FIG. 5 ends in step 550.

Exemplary Prototype System

Figure 6:
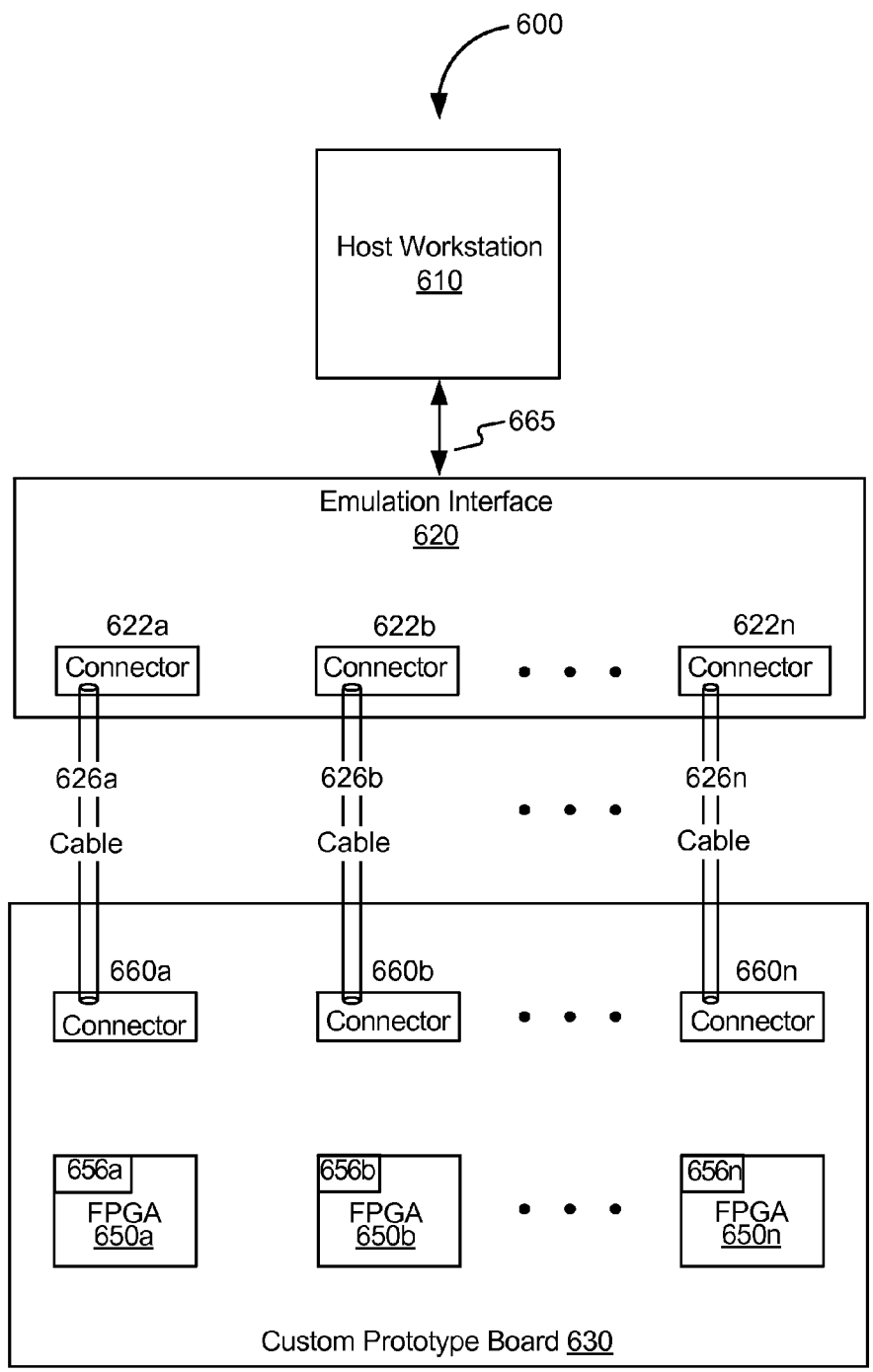
FIG. 6 is a block diagram illustrating an exemplary prototype system consistent with disclosed embodiments comprising n FPGA chips that may be used for emulation-based functional qualification.

FIG. 6 is a block diagram illustrating exemplary prototype system 600 consistent with disclosed embodiments comprising n FPGA chips that may be used for emulation-based functional qualification. By way of example, and as illustrated in FIG. 6, prototype system 600 can include a combination of hardware components, emulation interface, and a reconfigurable verification module adapted to improve visibility and control of a device under test during a design verification process. Emulation-based functional qualification system 100 may be embodied as prototype system 600.

Prototype system 600 can include host workstation 610 connected through bus 615 to emulation interface 620, which is connected through connectors 622a, 622b, . . . 622n to prototype board (or interchangeably, custom prototype boards) 630. In some embodiments, custom prototype board 630 can be any emulation hardware of customers/engineers/companies who use the device to emulate circuit designs. For example, one or more custom prototype boards may include one or more Field Programmable Gate Arrays ("FPGAs"), such as FPGAs 650a-650n, which may emulate a design, circuit, or device under test (DUT), and connectors 660a-660n. Additionally, verification modules 651a-651n can be configured or be capable of being configured and combined with partitioned portions of the design designated to each FPGA chip of 650a-650n. As shown in FIG. 6, custom prototype board 630 can include one or more FPGA chips (for example, FPGA chips 650a, 650b through 650n), one or more connectors (for example, connectors 660a, 660b, through 660n) and corresponding number of cables (for example, cables 626a, 626b, through 626n).

Figure 7:
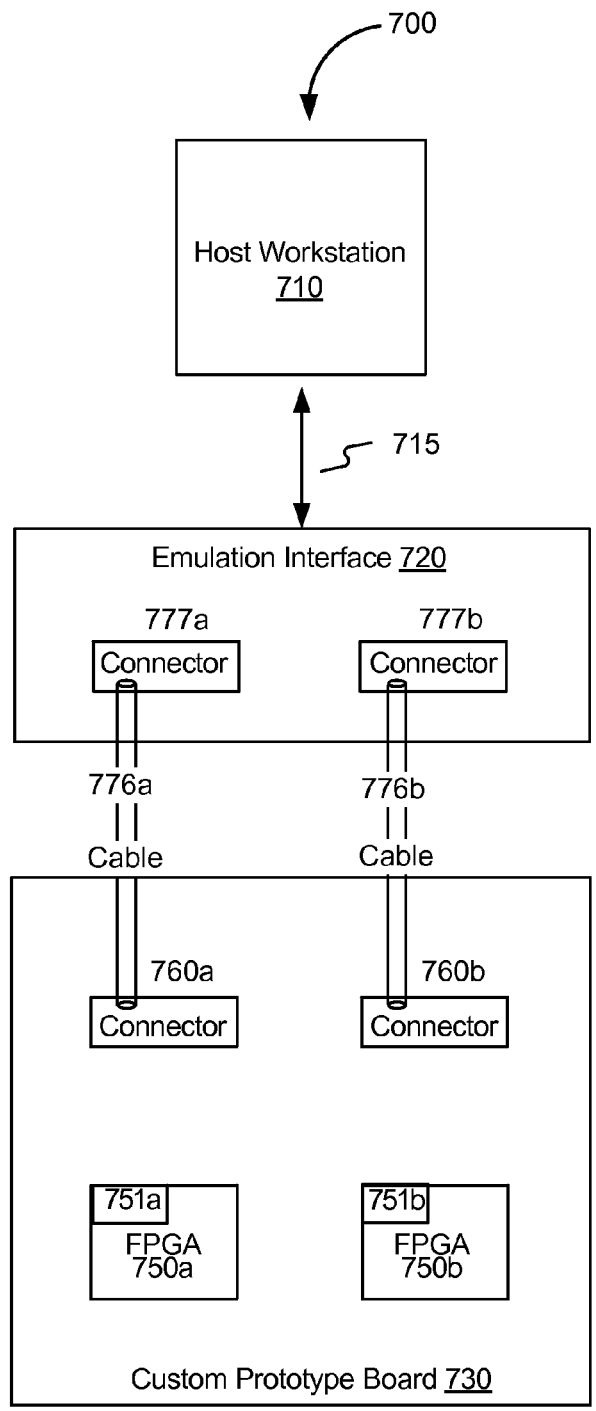
FIG. 7 is a block diagram illustrating another exemplary prototype system consistent with disclosed embodiments comprising two FPGA chips that may be used for emulation-based functional qualification.

In some embodiments, the number of FPGA chips 650 can vary from a number as low as one to a large number n. An exemplary system comprising two FPGA chips, 750a and 750b, is illustrated by FIG. 7. FIG. 7 is a block diagram illustrating another exemplary prototype system 700 consistent with disclosed embodiments comprising two FPGA chips that may be used for emulation-based functional qualification.

Exemplary system of FIG. 7 also comprises two connectors, 760a and 760b, within custom prototype board 730, two connectors, 722a and 722b, within emulation interface 720, and two cables, 726a and 726b, coupling between custom prototype board 730 and emulation interface 720. This exemplary prototype system includes custom prototype board 730 with two FPGA chips, 750a and 750b. The disclosure, however, is not limited to custom prototype board 730 with two FPGA chips, 750a and 750b, but rather extends to custom prototype boards with any number of FPGA chips, as can be determined by a user.

Host workstation 710 can be coupled with emulation interface device 720 over host communication channel 715 using an interface communication protocol, such as one of the computer interface standards. For example, in some embodiments, host communication channel 715 can be a wired communication method, such as Peripheral Component Interconnect (PCI) Express, IEEE 6394, Ethernet, or other interface methods allowing exchange of commands and data between host workstation 710 and emulation interface 720. Emulation interface 720 and custom prototype board 730 are coupled with cables 726a and 726b between connectors 760a and 760b on custom prototype board 730 and connectors 722a and 722b on emulation interface 720. Emulation interface 720 may be, for example, a board, a card, or another device.

Figure 8:
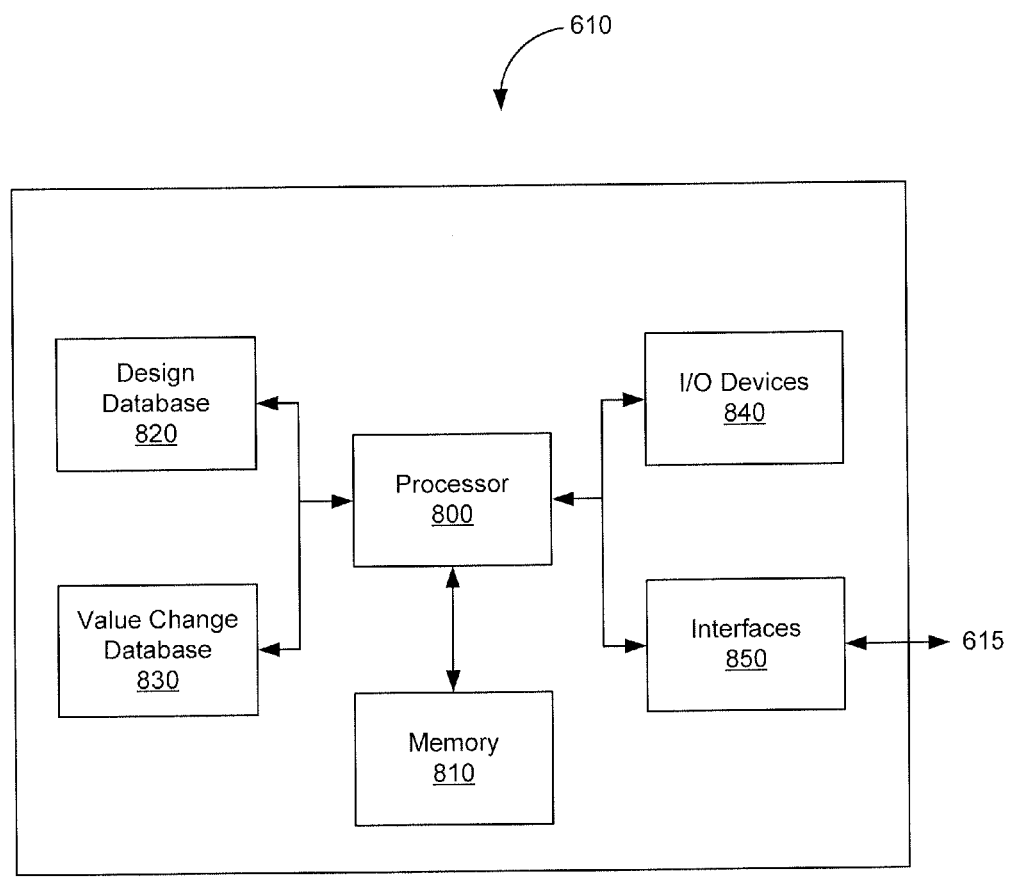
FIG. 8 is a block diagram of an exemplary host workstation consistent with disclosed embodiments.

FIG. 8 illustrates a block diagram of an exemplary host workstation 610 consistent with disclosed embodiments. Host workstation 710 of FIG. 7 may also be similarly configured. By way of example, and as illustrated in FIG. 8, host workstation 610 can include one or more of the following components: at least one processor 800, which can be configured or be capable of being configured to execute computer programs instructions to perform various prototype system instructions and methods, memory 810, which can be configured or be capable of being configured to store and provide information and computer program instructions, design database 820, which can be configured or be capable of being configured to maintain runtime software and design information, value-change database 830 to store information received from custom prototype board 630, Input/Output ("I/O") devices 840, and interfaces 850.

As used herein, the term "processor" can include an electric circuit that executes one or more instructions. For example, such a processor can include one or more integrated circuits, microchips, microcontrollers, microprocessors, embedded processor, all or part of a central processing unit (CPU), digital signal processors (DSP), FPGA or other circuit suitable for executing instructions or performing logic operations. Processor 800 can be a special purpose process in that it can be configured or be capable of being configured and programmed to operate as a verification processor programmed to exchange commands and data with custom prototype board 630. For example, processor 800 can act upon instructions and data output from memory 810, design database 820, value change database 830, I/O devices 840, interfaces 850, or other components (not shown). In some embodiments, processor 800 can be coupled to exchange data or commands with memory 810, design database 820, and value change database 830. For example, processor 800 can execute instructions that sends FPGA image data containing verification module 651a and 651b and a portion of DUT to FPGA chips 650a and 650b during prototype system downloads.

In accordance with some embodiments, more than one processor can be configured to operate independently or collaboratively. All processors can be of similar construction, or they can be of differing constructions electrically connected or disconnected from each other. As used herein, "construction" can include physical, electrical, or functional characteristics of the processor. Processors can be physically or functionally separate circuits or integrated in a single circuit. They can be coupled electrically, magnetically, optically, acoustically, mechanically, wirelessly or in any other way permitting communicated between them.

In accordance with some embodiments, memory 810 can be a computer readable memory, such as a random access memory (RAM), a read-only memory (ROM), a programmable read-only memory (PROM), a field programmable read-only memory (FPROM), a hard disk, an optical disk, a magnetic medium, a flash memory, other permanent, fixed, volatile memory, non-volatile memory, or any other tangible mechanism capable of providing instructions to processor 800 or similar component. For example, memory 810 can store instructions and data to perform verification functions on custom prototype board 630 in accordance with information stored in design database 820. Memory 810 can be distributed. That is, portions of memory 810 can be removable or non-removable, or located in geographically distinct locations.

In accordance with some embodiments, design database 820 can be a structured collection of tables, lists, or other data for design verification setup and runtime execution. As such, the structure can be organized as a relational database or an object-oriented database. In other embodiments, design database 820 can be a hardware system comprising physical computer readable storage media and input and/or output devices configured or be capable of being configured to receive and provide access to tables, lists, or other data structures. Further, configured as a hardware system design database 820 can include one or more processors and/or displays.

While similar in structure, value change database 830 can be configured or be capable of being configured to store information received from custom prototype board 630. For example, value change database can be configured or be capable of being configured to store information related to signal values captured by signal probes associated with verification modules 651*a* and 651*b*. In accordance with some embodiments I/O devices 840 can be one or more of a mouse, stylus, key device, audio input/output device, imaging device, printing device, display device, sensor, wireless transceiver, or other similar device. I/O devices 840 can also include devices that provide data and instructions to memory 810, processor 800, design database 820, or value change database 830.

In accordance with some embodiments, interfaces 850 can include external or integrated interface device or interface port, such as PCI Express, Ethernet, FireWire®, USB, and wireless communication protocols. For example, interfaces 850 can be a PCI Express device coupled to communicate with emulation interface 620 using host communication channel 615. IO devices 840 can also include a graphical user interface, or other humanly perceivable interfaces configured to present data.

Figure 9:
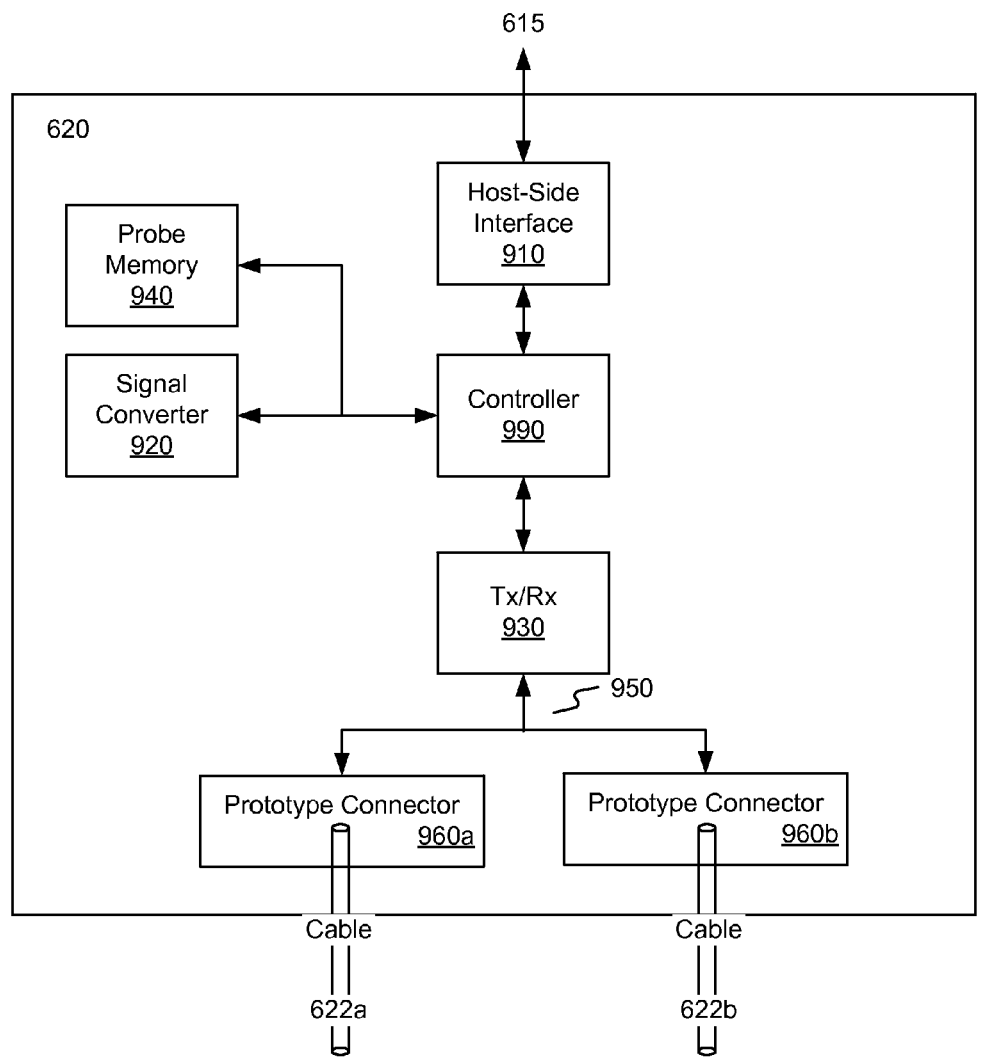
FIG. 9 is a block diagram of an exemplary emulation interface consistent with disclosed embodiments.

FIG. 9 illustrates a block diagram of an exemplary emulation interface 620 consistent with disclosed embodiments. By way of example, and as illustrated in FIG. 9, emulation interface 620 can include one or more of host-side interface 910, controller 900, signal converter 920, probe memory 940, transceiver 930, and prototype connectors 960*a* and 960*b*.

Host-side interface 910 can be similar to interfaces 850 and configured or be capable of being configured to facilitate communication with host workstation 610 using host communication channel 615. In other embodiments, host-side interface 910 can be different from interfaces 850, and can include physical or logical signal conversion components to facilitate communication with host workstation 610.

In accordance with some embodiments, controller 900 can be a component similar to processor 800. In some embodiments, controller 900 can act upon data or instructions received from host workstation 610 through host-side interface 910, signal converter 920, or custom prototype board 630 through transceiver 930 and at least one of prototype connectors 960*a* and 960*b*. For example, controller 900 can exchange commands and/or data with one or more verification modules 651 (for example, one or more of 651*a* and 651*b*) to control and monitor a device state associated with one or more of FPGA devices 650*a* and 650*b*.

In some embodiments, the commands and/or data can include a pattern feed and results of a co-simulation to be stored in a memory of a prototype board. In other embodiments, the commands and/or data can be signal values associated with probed signals. In other embodiments, controller 900 can send commands or data to at least one of verification modules, 651*a* and 651*b*, causing the at least one of verification modules to modify, among other things, test patterns, the amount of data captured, the number or type of signals probed, and the like. As shown in FIG. 9, controller 900 can be coupled to receive data or instructions from probe memory 940 and transceiver 930. In some embodiments, controller 900 can, for example, act upon instructions to send timing and control information to verification modules, 651*a* and 651*b*, located in each FPGA chip, 650*a* and 650*b*, on custom prototype board 630. Instructions can include, but are not limited to, configuration parameters and runtime control information received from host-side interface 910.

Timing and control information can include, but is not limited to, commands and data associated with probing signals to gather time-based or state-based information associated with a device or device state. Timing information can include clock signals generated, received, or processed by controller 900. Timing signals can also include start, stop, and reset signals. Received by verification module 651 (at least one of 651*a* and 651*b*), timing information can serve as basis to probe, capture, and process timing and state analysis data associated with a device under test. For example, timing and control information sent by controller 900 can provide a basis for creating a trigger sequence, capturing data from the device under test, assigning a time reference to captured data, sampling signal values, and configuring one or more signals within FPGA 650 (at least one of 650*a* and 650*b*) to be used as a clock when performing state analysis.

In some embodiments, controller 900 can be configured or be capable of being configured to store data captured from FPGA chips, 650*a* and 650*b*, in probe memory 940. In some embodiments, the data received from FPGA chips, 650*a* and 650*b*, can be encoded. In some embodiments, the data received from FPGA chips, 650*a* and 650*b*, can be received from verification modules, 651*a* and 651*b*. Data can include timing data, state data, and meta data associated with the captured data. Meta data can include, among other things, a time reference or signal name. Captured data associated with a particular signal or signals stored in probe memory 940 can be compared to data associated with the same signal, but captured at a later time. In some embodiments, controller 900 can also be configured or be capable of being configured to encode and/or decode data exchanged with one or more verification modules 651*a* and 651*b* located in each FPGA chip, 650*a* and 650*b*.

Signal converter 920 can include a processor specifically configured or be capable of being configured to convert data exchanged over transceiver 930 into a suitable format for processing by host workstation 610.

Transceiver 930 can include any appropriate type of transmitter and receiver to transmit and receive data from custom prototype board 630. In some embodiments, transceiver 930 can include one or a combination of desired functional component(s) and processor(s) to encode/decode, modulate/demodulate, and to perform other functions related to the communication channel between emulation interface 620 and custom prototype board 630. Transceiver 930 can be coupled to communicate with custom prototype board 630 over emulation interface communication channel 950. In some embodiments, emulation interface communication channel 950 can, for example, utilize TDM (time-division-multiplexing) to exchange data with custom prototype board 630.

Prototype connectors 960*a* and 960*b* can be a J-connector or other connector type with signal transmission properties suitable to exchange commands and data between controller 900 and custom prototype board 630. Prototype connectors 960a and 960b can be configured or be capable of being configured to receive corresponding J-connector compatible cables 626a and 626b, respectively. In some embodiments, emulation interface 620 can include greater than or less than two prototype connectors in accordance with the particular system requirements. Emulation interface 620 can be configured or be capable of being configured to enable various logical configurations, both predefined and configurable, to physically connect to FPGA chips 650a and 650b.

Returning to FIG. 6, exemplary custom prototype board 630 can be a pre-fabricated or customized test device suitable for testing the design under test implemented in one or more FPGA chips 650a and 650b. By way of example, and as illustrated in FIG. 6, custom prototype board 630 can include one or more FPGA devices 650a and 650b, coupled to communicate with emulation interface 620 through connectors 622a and 622b, and 660a and 660b. Although depicted as two connectors, connectors 622 and 660 can be as few as one or more connectors, such as a J-connector or similarly suitable connector. Similarly, although depicted as including two FPGA devices 650a and 650b, custom prototype board 630 can have one or more FPGA devices 650 in accordance with the particular system requirements.

Figure 10:
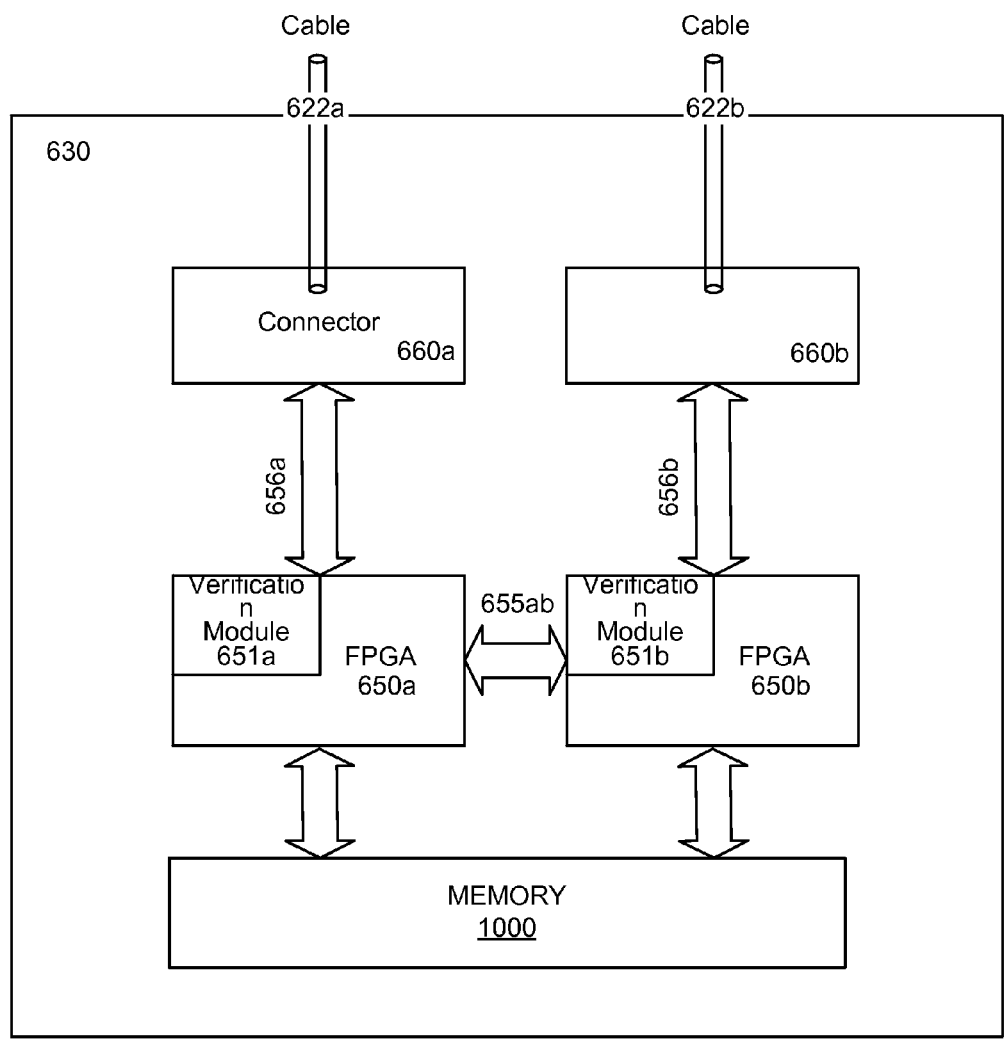
FIG. 10 is a block diagram illustrating an exemplary custom prototype board consistent with disclosed embodiments.

FIG. 10 illustrates custom prototype board 630 in more detail. By way of example, as illustrated in FIG. 10, custom prototype board 630 can include FPGA chips 650a and 650b, connectors 660a and 660b, interconnections 656a and 656b, and interconnections 655ab. Embodiments in accordance with custom prototype board 630 can be open systems in the sense that custom prototype board 630 can be customized in accordance with customer's specifications by, for example, custom designing interconnections 656a and 656b, and interconnections 655ab. Custom prototype board 630 can contain various numbers of FPGA chips (for example, FPGA chips 650a-250n) whose pins are interconnected in customer preferred configurations. In addition, custom prototype board 630 can contain a number of connectors 660a and 660b which are connected to FPGA chips 650a and 650b according to a user's choice and in a user's preferred configurations. Embodiments in accordance with these aspects can utilize custom prototype board 630 by describing custom designed interconnections, and other custom configurations in user generated device description files.

In some embodiments, custom prototype board 630 can be configured or be capable of being configured to load data from memory 1000 and/or retrieve data from FPGA chips, 650a and 650b, and store the data in memory 1000.

In accordance with some embodiments, verification module 651 can include at least one of instrumentation circuitry and logic modules configured or be capable of being configured to perform traditional logic analysis instrumentation functions. Logic analysis functions performed by verification module 651, can include, for example, sampling of signal values, state analysis, protocol analysis, and triggering. Verification module 651 may further be configure to perform a comparison between the state of the DUT and results of a co-simulation stored in memory 1000.

In some embodiments, verification module 651 can be synthesizable or soft intellectual property (IP). Configuration parameters defining verification module 651 can be set during the design verification setup process, such as in a manner similar to flows for programming FPGA chips 650a and 650b. For example, during setup in some embodiments, the setup flow can automatically integrate third party synthesis and place and route tools, automatically or manually partition a design, and construct a design database for runtime software usage. A setup flow can include, for example, an automatic process for a pre-partitioned design, where the register transfer language (RTL) partitioning tool includes either a third party tool or a user's own manual partitioning. Alternatively or additionally, a setup flow can also include a flow where the user's design is not manually partitioned at the RTL level. In some embodiments, verification module 651 can be defined by Hardware Description Language (HDL) code and further verification module 651 can be merged with a partitioned portion of a circuit design to form an image data that can be downloaded to at least one of FPGA chips 650a and 650b. In some other embodiments, verification module 651 can be defined by netlist descriptions.

To optimize the physical pin resources available in a particular custom prototype board 630, verification module 651 comprises both design-dependent and design-independent circuitry. Throughout the detailed description, verification module 651 can refer to at least one of the verification modules 651a and 651b. For example, verification module 651 can include a design-dependent circuit, configured or be capable of being configured to connect to and probe specific signals. A probe or signal probe can include circuitry configured to analyze or sample the state of a particular signal. Utilizing access to design database 820 associated with the device under test, data dependent circuitry can be reconfigured during a test process to modify, remove, or add probes. In some embodiments, design database 820 can identify the signals to be probed by verification module 651 and also can identify the frequency of monitoring those signals to be probed. Verification module 651 can also include design-independent circuits configured or be capable of being configured to encode and decode data. For example, data-independent circuits can include, among other circuit types, first input first output (FIFO) and control state machine for sending data captured by verification module 651 to at least one of controller 900 and host workstation 610 for processing. Configuration parameters defining verification module 651 can be set during the design verification setup process.

Operationally, verification module 651 can respond to configuration parameters set during setup process or modified during testing. Based on these parameters, verification module 651 captures and sends a full design state snapshot of the portion of the device under test, performs cycle to cycle analysis, and/or performs the required emulation. Data captured by verification module 651 can be post-processed by a computing device or component, such as emulation interface 620 or host workstation 610. Post processing can include, but is not limited to, timing, state, and protocol analysis. Prior to processing data captured by verification module 651, captured data can be stored in value change database 830. In other embodiments, captured data can be stored in value change database 830 after processing.

Figure 11:
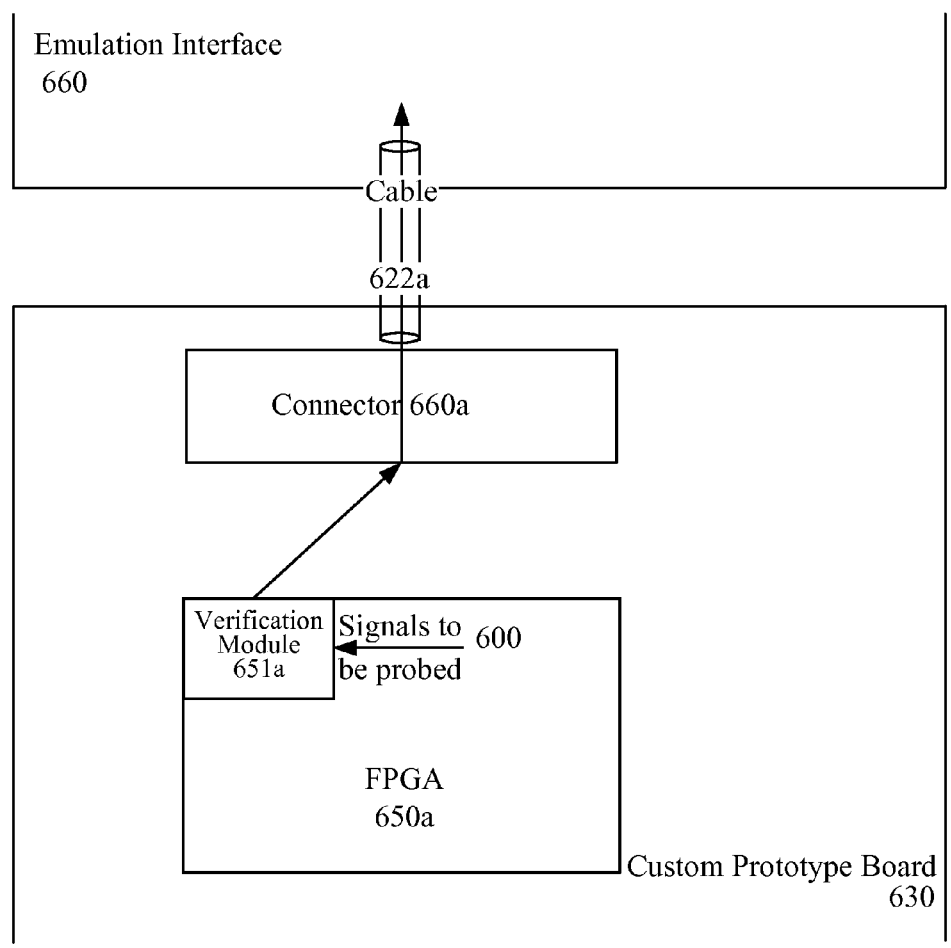
FIG. 11 is a block diagram illustrating an exemplary signal data path consistent with disclosed embodiments.

FIG. 11 shows signals 600 to be probed which are coming from portions of user design in FPGA chips 650a and 650b on custom prototype board 630, and are transmitted to emulation interface 620. Signals 600 to be probed are sampled and passed on to emulation interface 620 by verification modules 651a and 651b. The device description files are referenced when verification modules 651a and 651b are created during setup flow. In FIG. 11, probe signals 600 are coupled with verification module 651a of FPGA 650a, and verification module 651a is configured or be capable of being configured in accordance with the device description files such that sampled probe signals 600 are propagated to appropriate FPGA pins of FPGA 650a, which then can travel through the connector 660a, cable 626a, and arrive at their destination in emulation interface 620.

CONCLUSION

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A test system comprising:
    a prototype board;
    a processor; and
    a memory storing instructions which when executed by the processor configure the processor to:
        receive an integrated circuit design having one or more mutations;
        program the prototype board according to the integrated circuit design and a verification module;
        store a set of test patterns and response generated by a simulation of the integrated circuit using the set of test patterns in a memory of the prototyping board; and
        receive mutation information from the verification module based on the set of test patterns stored in the memory of the prototyping board.

2. The test system of claim 1 wherein to program the prototype board according to the integrated circuit design and the verification module, the process is configured to program the prototype board such that one or more of the one or more mutations are a look-up table-based mutant in the integrated circuit design allowing rapid mutant reconfiguration.

3. The test system of claim 1 wherein to program the prototype board according to the integrated circuit design and the verification module, the process is configured to program the prototype board such that one or more of the one or more mutations are an RTL-level mutant allowing rapid mutant reconfiguration using a constant net.

4. The test system of claim 1 wherein the verification module is configured to:
    probe one or more signals from the integrated circuit design under test; and
    compare the one or more probed signals to the response stored in the memory of the prototyping board; and
    generate the mutation information based on results of comparing the one or more probed signals to the response stored in the memory of the prototyping board.

5. The test system of claim 1 wherein the processor is further configured to:
    receive one or more design changes to the integrated circuit design;
    re-program the prototype board according to an updated integrated circuit design and the verification module;
    store a modified set of test patterns and response generated by a simulation of the updated integrated circuit using the set of test patterns in the memory of the prototyping board; and
    receive additional mutation information from the verification module based on the modified set of test patterns stored in the memory of the prototyping board.

6. The test system of claim 1 wherein to program the prototype board according to the integrated circuit design and the verification module, the processor is further configured to:
    receive mutant prioritization information based on one or more activation test;
    prioritize enumeration of mutations based on the mutant prioritization information.

7. The test system of claim 6 wherein mutants are prioritized based on historical qualification information.

8. A method for functional qualification of an integrated circuit design, the method comprising:
    receiving, at one or more computer systems, an integrated circuit design having one or more mutations;
    programing, with one or more processors associated with the one or more computer systems, a prototype board according to the integrated circuit design and a verification module;
    storing, with one or more processors associated with the one or more computer systems, a set of test patterns and response generated by a simulation of the integrated circuit using the set of test patterns in a memory of the prototyping board; and
    receiving, at the one or more computer systems, mutation information from the verification module based on the set of test patterns stored in the memory of the prototyping board.

9. The method of claim 8 wherein programming the prototype board according to the integrated circuit design and the verification module comprises programming the prototype board such that one or more of the one or more mutations are a look-up table-based mutant in the integrated circuit design allowing rapid mutant reconfiguration.

10. The method of claim 8 wherein programming the prototype board according to the integrated circuit design and the verification module comprises programming the prototype board such that one or more of the one or more mutations are an RTL-level mutant allowing rapid mutant reconfiguration using a constant net.

11. The method of claim 8 wherein the verification module is configured to:
   probe one or more signals from the integrated circuit design under test; and
   compare the one or more probed signals to the response stored in the memory of the prototyping board; and
   generate the mutation information based on results of comparing the one or more probed signals to the response stored in the memory of the prototyping board.

12. The method of claim 8 further comprising:
   receiving one or more design changes to the integrated circuit design;
   re-programing the prototype board according to an updated integrated circuit design and the verification module;
   storing a modified set of test patterns and response generated by a simulation of the updated integrated circuit using the set of test patterns in the memory of the prototyping board; and
   receiving additional mutation information from the verification module based on the modified set of test patterns stored in the memory of the prototyping board.

13. The method of claim 8 wherein programming the prototype board according to the integrated circuit design and the verification module comprises:
   receiving mutant prioritization information based on one or more activation test;
   prioritizing enumeration of mutations based on the mutant prioritization information.

14. The method of claim 13 wherein mutants are prioritized based on historical qualification information.

15. A non-transitory computer-readable medium for functional qualification of an integrated circuit design, the non-transitory computer-readable medium comprising:
   code for receiving an integrated circuit design having one or more mutations;
   code for programing a prototype board according to the integrated circuit design and a verification module;
   code for storing a set of test patterns and response generated by a simulation of the integrated circuit using the set of test patterns in a memory of the prototyping board; and
   code for receiving mutation information from the verification module based on the set of test patterns stored in the memory of the prototyping board.

16. The non-transitory computer-readable medium of claim 15 wherein the code for programming the prototype board according to the integrated circuit design and the verification module comprises code for programming the prototype board such that one or more of the one or more mutations are a look-up table-based mutant in the integrated circuit design allowing rapid mutant reconfiguration.

17. The non-transitory computer-readable medium of claim 15 wherein the code for programming the prototype board according to the integrated circuit design and the verification module comprises code for programming the prototype board such that one or more of the one or more mutations are an RTL-level mutant allowing rapid mutant reconfiguration using a constant net.

18. The non-transitory computer-readable medium of claim 15 wherein the verification module is configured to:
   probe one or more signals from the integrated circuit design under test; and
   compare the one or more probed signals to the response stored in the memory of the prototyping board; and
   generate the mutation information based on results of comparing the one or more probed signals to the response stored in the memory of the prototyping board.

19. The non-transitory computer-readable medium of claim 15 further comprising:
   code for receiving one or more design changes to the integrated circuit design;
   code for re-programing the prototype board according to an updated integrated circuit design and the verification module;
   code for storing a modified set of test patterns and response generated by a simulation of the updated integrated circuit using the set of test patterns in the memory of the prototyping board; and
   code for receiving additional mutation information from the verification module based on the modified set of test patterns stored in the memory of the prototyping board.

20. The non-transitory computer-readable medium of claim 15 wherein the code for programming the prototype board according to the integrated circuit design and the verification module comprises:
   code for receiving mutant prioritization information based on one or more activation test;
   code for prioritizing enumeration of mutations based on the mutant prioritization information.

21. The non-transitory computer-readable medium of claim 20 wherein mutants are prioritized based on historical qualification information.

* * * * *